United States Patent [19]

Horii

[11] 4,407,872

[45] Oct. 4, 1983

[54] SHEET MATERIAL AND ENVELOPE FOR PACKAGING ELECTRONIC PARTS

[75] Inventor: Shigeo Horii, Kyoto, Japan

[73] Assignee: Ricoh Co. Ltd., Japan

[21] Appl. No.: 326,917

[22] Filed: Dec. 2, 1981

[30] Foreign Application Priority Data

Jun. 2, 1981 [JP] Japan .................................. 56-85310
Jun. 2, 1981 [JP] Japan .................................. 56-85311

[51] Int. Cl.³ ........................ B65D 27/18; B32B 3/10; B32B 15/08
[52] U.S. Cl. ..................................... 428/35; 428/200; 428/201; 428/204; 428/207; 428/209; 428/332; 428/336; 428/344; 428/347; 428/349; 428/354; 428/458; 428/463; 428/913; 428/922
[58] Field of Search ............... 428/461, 463, 458, 344, 428/347, 349, 336, 35, 204, 922, 212, 913, 200, 201, 207, 209, 332, 354

[56] References Cited

U.S. PATENT DOCUMENTS

| | | | |
|---|---|---|---|
| 4,154,344 | 5/1979 | Yenni, Jr. et al. | 428/922 |
| 4,156,751 | 5/1979 | Yenni, Jr. et al. | 428/212 |
| 4,329,395 | 5/1982 | Pickford | 428/344 |

*Primary Examiner*—Thomas J. Herbert, Jr.
*Attorney, Agent, or Firm*—McGlew and Tuttle

[57] ABSTRACT

The sheet material for packaging electronic parts consists of a laminated material which comprises a transparent plastic film layer and a thin metal film layer having a light transmittance of at least 25% and an electric resistance of less than $10^8$ ohms/cm². The sheet material is heat-sealable at the surface of said metal film layer. An envelope for packaging electronic parts is made of the sheet material by heat-sealing in a state of disposing the plastic film layer outside.

14 Claims, 7 Drawing Figures

SHEET MATERIAL AND ENVELOPE FOR PACKAGING ELECTRONIC PARTS

BACKGROUND OF THE INVENTION

This invention relates to a sheet material and an envelope for packaging electronic parts.

Such electronic parts as semiconductors, which are vulnerable to static electricity, can be easily damaged by static electrification before and after they are attached to electronic circuits, presenting a serious problem.

Thus, protection of electronic parts from static electricity has heretofore resorted to the use of metal foils and plastic films having electrically conductive materials, such as carbon and metal powders, incorporated therein as packaging materials for electronic parts.

However, these materials, all of which are opaque, as such, do not allow visual inspection to ascertain whether the contents, or electronic parts, are present and whether they are damaged or to ascertain their type. On the other hand, plastic films having antistatic agents incorporated therein are available, but their electric resistance is so high that they are altogether unsuitable for protection of electronic parts, and depending upon the type of the antistatic agent used, they can be easily influenced by humidity, a lack of stability.

An object of the invention is to provide a sheet material for packaging electronic parts, through which the contents or electronic parts can be seen and which is effective to protect electronic parts from static electricity.

Another object of the invention is to provide an envelope for effectively protecting electronic parts.

Other objects and advantages of the invention will be apparent from the following detailed description.

SUMMARY OF THE INVENTION

The sheet material for packaging electronic parts according to the invention consists of a laminated material which comprises a transparent plastic film layer and a thin metal film layer having a light transmittance of at least 25% and an electric resistance of less than $10^8$ ohms/cm$^2$. The sheet material is heat-sealable at the surface of said metal film layer.

An envelope for packaging electronic parts is made of the sheet material by heat-sealing in a state of disposing the plastic film layer outside.

The transparent plastic film layer may be per se heat-sealable. A heat-sealable resin film layer may be formed partially or wholly between the transparent plastic film layer and the thin metal layer or on the thin metal film layer coated on the transparent plastic film layer.

DETAILED DESCRIPTION OF THE INVENTION

The transparent plastic film layer may be made from polyester, acrylic resin, polyvinyl chloride, fluorine resin, polystyrene, polypropylene, polyethylene and any other material which can be used as packaging materials.

The transparent plastic film layer desirably has a thickness of 4 to 100 microns. If the thickness of the transparent plastic film layer is less than 4 microns, it is too thin and too weak to be used for a packaging material. On the other hand, the transparent plastic film having a thickness of more than 100 microns is so stiff and springy that handling operation during heat sealing and after formation of an envelope becomes inconvenient.

The metal film layer in the invention may be produced in a conventional method such as vacuum plating, ion plating (chemical plating), electron-beam plating, sputtering and the like.

As the thin metal film, there are included all thin films made of simple metal substances, alloys and metal compounds such as Cr, Al, Ni, Fe, In, Ag, Au, Cu, Sn, Ti, Ni-Cr, $In_2O_3$, $SnO_2$, In-Sn-$O_2$ series and the like.

The thin metal film layer must meet the conditions that the light transmittance is at least 25% and the electric resistance is less than $10^8$ ohms/cm$^2$. These conditions are indispensable for the attainment of the objects of the invention.

More particularly if the light transmittance is less than 25%, it becomes difficult to see the contents through the sheet material. Further, if the electric resistance is more than $10^8$ ohms/cm$^2$, the electric conductibility is poor and insufficient to protect electronic parts from static electricity.

An envelope for packaging and protecting electronic parts is made of the laminated material by heat-sealing in a state of disposing the plastic film layer outside. Accordingly, when the transparent plastic film layer is per se heat-sealable or a heat-sealable resin film layer is formed between the transparent plastic film layer and the thin metal film layer, it is important that the thin metal film layer is pervious to the heat-sealable plastic material or resin on heating. In this case, the thickness of the metal film layer is preferably within the range of 20 Å to 250 Å.

When a heat-sealable resin film layer is formed wholly on the thin metal film layer laminated on the transparent plastic film layer or between the transparent plastic film layer and the metal film layer, the heat-sealable resin film layer should be transparent to see the contents through the laminated material.

Further, a heat-sealable resin film layer may be partially formed in a given pattern on the metal film layer or between the transparent plastic film layer and the metal film layer. In this case, since the contents can be seen through the laminated material without an obstacle of the heat-sealable resin film layer, the heat-sealable resin film layer may be opaque or coloured.

When the heat-sealable resin film layer is partially formed between the transparent plastic film layer and the thin metal film layer, the thickness of the metal film layer is also preferably within the range of 20 Å to 250 Å.

Among the heat-sealable resin film layer used in the invention, there are included those made from polyethylene, soft polyvinyl chloride, modified polyester, polypropylene, ionomer, EVA and other heat-sealable materials.

The heat materials according to the present invention are mainly used for packaging electronic parts, but they may be used as a covering on a working desk or a box for electronic parts.

BRIEF DESCRIPTION OF THE DRAWINGS

The invention will be further described with reference to the accompanying drawings.

In FIG. 1, a metal film layer 2 is coated on a heat-sealable transparent plastic film 1.

In FIG. 2, a heat-sealable resin film layer 3 is formed on a transparent plastic film 1 and a metal film layer 2 is coated on the heat-sealable resin film layer 3.

In FIG. 3, a metal film layer 2 is coated on a transparent plastic film 1 and a heat-sealable resin film layer 3 is formed on the metal film layer 2.

In FIG. 4, a metal film layer 2 is coated on transparent plastic film layer 1 and a heat-sealable resin film layer 3 is formed partially on the metal film layer 2.

In FIG. 5, a heat-sealable resin film layer 3 is formed partially on a transparent plastic film 1 and a metal film layer 2 is coated on the heat-sealable resin film layer 3 comprising surface of the transparent plastic film 1.

Figure 1:
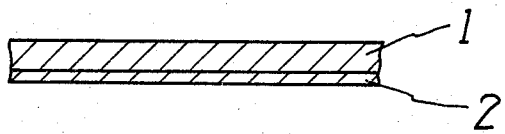
FIGS. 1, 2, 3, 4 and 5 are expanded sectional views of sheet materials for packaging electronic parts according to the present invention.
Figure 2:
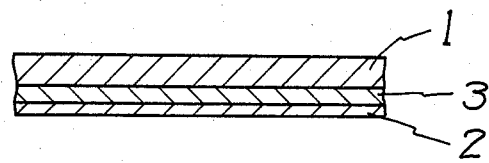
Figure 3:
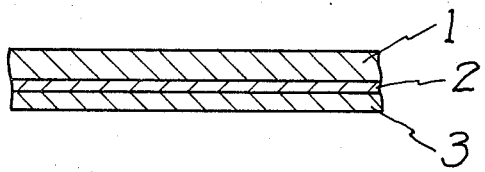
Figure 4:
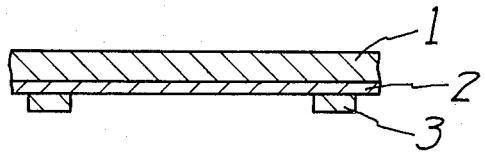
Figure 5:
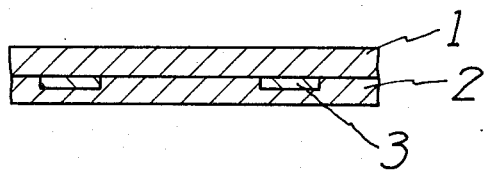

Each of the heat-sealable resin film layers 3 in FIGS. 4 and 5 is located on the portion which will be actually heat-sealed to form an envelope for packaging electronic parts.

The sheet materials in FIGS. 1 to 5 are useful for packaging electronic parts and used to form an envelope adapted to protect electronic parts.

Figure 6:
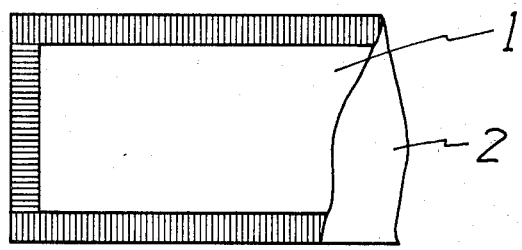
FIG. 6 is perspective view of an envelope made of the sheet material illustrated in FIG. 2.
Figure 7:
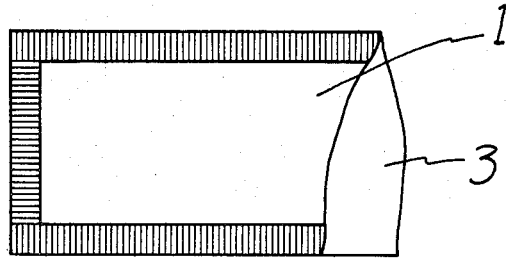
FIG. 7 is perspective view of an envelope made of the sheet material illustrated in FIG. 3.

The envelope for enclosing electronic parts, as shown in FIGS. 6 and 7, is made of the sheet materials by heat-sealing in a state of disposing the transparent plastic film 1 outside.

In the present invention, since electric resistance of the metal film layer 2 is not more than $10^8$ ohms/cm$^2$, electronic parts can be fully protected from static electricity produced inside and outside the envelope. Further, the envelope according to the present invention has a metal film layer 2 positioned inside the transparent plastic film 1 so that it is highly weather-resistant.

The transparent plastic film 1 may contain an antistatic agent or may be formed on one or both surfaces thereof with a layer containing an antistatic agent. Further, an antistatic agent may be contained in the heat-sealable resin layer 3 or such layer containing an antistatic agent may be provided on any other suitable place.

DETAILED DESCRIPTION OF THE PREFERRED EMBODIMENT

The following examples serve to illustrate the invention in more detail although the invention is not limited to the examples.

EXAMPLE 1

A polyethylene film of 40 microns was prepared as a base sheet. Chromium was deposited on a surface of the base sheet by a vacuum plating from a distance of 25 cm with a vacuum degree of $1 \times 10^{-4}$ Torr for about 20 seconds to form a chromium film layer of 50 Å having a resistance of $1 \times 10^5$ ohms/cm$^2$ and a light transmittance of 75%.

An envelope was made of the resultant sheet material by heat-sealing in a state of disposing the polyethylene film outside.

EXAMPLE 2

A heat-sealable polyester film (Melinex type #850 manufactured by Imperial Chemical Industries Limited), which consists of a polyester film of 25 microns and a modified polyester film layer coated thereon, was prepared as a base sheet. Chromium was deposited on the modified polyester coated surface of the base sheet in the same manner as in Example 1 to form a chromium film layer of 50 Å having a resistance of $1 \times 10^5$ ohms/cm$^2$ and a light transmittance of 75%.

An envelope was made of the resultant sheet material by heat-sealing in a state of disposing to polyester film outside.

EXAMPLE 3

A transparent polyester film of 38 microns (Diafoil manufactured by Diafoil Company) was prepared as a base sheet. Chromium was deposited on a surface of the base sheet by a vacuum plating from a distance of 20 cm with a vacuum degree of $8 \times 10^{-5}$ Torr to form a chromium film layer of 220 Å having a resistance of 4 ohms/cm$^2$ area and a light transmittance of 27%. Further, a transparent polyethylene film was bonded to the chromium film layer.

An envelope was made of the resultant sheet material by heat-sealing in a state of disposing the polyester film outside.

EXAMPLE 4

By the same manner as in Example 3, aluminum was deposited on a surface of a transparent polyester film of 16 microns (Diafoil manufactured by Diafoil Company) to form an aluminum film layer of 60 Å having a resistance of 150 ohms/cm$^2$ and a light transmittance of 67%. Then the aluminum film layer was coated with EVA (ethylene-vinylacetate copolymer). Further, the non-metallized surface of the polyester film was coated with a cation type antistatic electronic agent.

An envelope was made of the resultant sheet material by heat-sealing in a state of disposing the non-metallized surface of the polyester film outside.

EXAMPLE 5

A surface of a transparent polyester film of 25 microns (Diafoil manufactured by Diafoil Company) was subjected to a magnetron spattering in an argon+oxygen mixed gas at a vacuum degree of $2 \times 10^{-2}$ Torr using indium as a target with a discharge power of 0.5 KV $\times$ 1.0 A. to form an indium oxide film layer of 300 Å having a resistance of $3 \times 10^6$ ohms/cm$^2$ and a light transmittance of 80%. Then only the necessary portion of the indium oxide film layer was partly coated with polyethylene.

An envelope was made of the resultant sheet material by heat-sealing in a state of disposing the polyester film outside.

EXAMPLE 6

A coloured polyethylene was coated partially on a given portion of a transparent polyester film of 25 microns. Chromium was deposited on the polyethylene-coated surface of the polyester film, but the same manner as in Example 1, to form a chromium film layer of 50 Å having a resistance of $1 \times 10^5$ ohms/cm$^2$ and a light transmittance of 75%.

An envelope was made of the resultant sheet material by heat-sealing in the state of disposing the polyester film outside.

Control 1

A heat-sealable antistatic polyethylene envelope (Pinkpoly Envelope manufactured by Tokyo Denki Kagaku Kabushiki Kaisha) was prepared.

Control 2

A laminated material which consists of a polyester film of 25 microns and a polyethylene film was used to form an envelope by heat-sealing in a state of disposing the polyester film outside.

Liquid crystal boards were enclosed in the envelopes prepared in the above Examples and Controls. The envelopes having the liquid crystal boards enclosed therein were then irradiated with (+) and (−) ions directed thereto at a distance of 10 cm by a 8,000–10,000 V static electricity generator (Antistatic pistol manufactured by Zerostat Instrument Limited), and letters and numbers on the liquid crystal boards were examined for their disturbance. The seeing-through qualities of the envelopes were also compared. The results are as shown in Table below.

|  | Disturbance of letters and numbers on the liquid crystal boards | Seeing-through qualities |
| --- | --- | --- |
| Example 1 | O | Good |
| Example 2 | O | Good |
| Example 3 | O | Good |
| Example 4 | O | Good |
| Example 5 | O | Good |
| Example 6 | O | Good |
| Control 1 | X | Good |
| Control 2 | X | Good |

Note:
O . . . Any disturbance was not found.
X . . . A gross disturbance was found.

What we claim is:

1. An envelope for packaging electronic parts, which is made of a laminated material comprising a transparent plastic film layer and a thin metal film layer having a light transmittance of at least 25% and electric resistance of less than $10^8$ ohms/cm$^2$, the laminated material being heat-sealed to form said envelope with the metal film layer provided on an inner surface of the envelope.

2. An envelope defined in claim 1, wherein said plastic film layer is heat-sealable and said metal film layer has a thickness within the range of 20 Å to 250 Å.

3. An envelope defined in claim 1, wherein a heat-sealable transparent resin film layer is formed between said plastic film layer and said metal film layer having a thickness within the range of 20 Å to 250 Å.

4. An envelope defined in claim 1, wherein a heat-sealable resin film layer is formed partially between said plastic film layer and said metal film layer which has a thickness within the range of 20 Å to 250 Å.

5. An envelope defined in claim 4, wherein said heat-sealable resin film layer is one of coloured and opaque.

6. An envelope defined in claim 1, wherein a heat-sealable resin film layer is formed partially on said metal film layer laminated on said transparent plastic film layer.

7. An envelope defined in claim 6, wherein said heat-sealable resin film layer is one of coloured and opaque.

8. A sheet material for packaging electronic parts, consisting essentially of a laminated material which comprises a transparent plastic film layer and a thin metal film layer having a light transmittance of at least 25% and an electric resistance of less than $10^8$ ohms/cm$^2$ said laminated material being heat-sealable at the surface of said metal film layer so that, by heat-sealing said laminated material to form an envelope, said metal film layer is at the inner surface of said envelope.

9. A sheet material defined in claim 8, wherein said metal film layer has a thickness with the range of 20 Å to 250 Å and is pervious to a heat-sealable plastic material of said plastic film layer when heated.

10. A sheet material defined in claim 8, wherein a heat-sealable transparent resin film layer is formed between said plastic film layer and said metal film layer, and the thickness of said metal film layer is within the range of 20 Å to 250 Å.

11. A sheet material defined in claim 8, wherein a heat-sealable resin film layer is formed partially between said plastic film layer and said metal film layer and the thickness of said metal film layer is within the range of 20 Å to 250 Å.

12. A sheet material defined in claim 11, wherein said heat-sealable resin film layer is one of coloured and opaque.

13. A sheet material defined in claim 8, wherein a heat-sealable resin film layer is formed partially on said metal film layer laminated on said transparent plastic film layer.

14. A sheet material defined in claim 13, wherein said heat-sealable resin film layer is one of coloured and opaque.

* * * * *

UNITED STATES PATENT AND TRADEMARK OFFICE
CERTIFICATE OF CORRECTION

PATENT NO. : 4,407,872
DATED : October 4, 1983
INVENTOR(S) : Shigeo Horii

It is certified that error appears in the above-identified patent and that said Letters Patent is hereby corrected as shown below:

On the title page, assignee should read

--(73) Assignee: Keiko Co., Ltd., Kyoto, Japan --

Signed and Sealed this

Seventh Day of May 1985

[SEAL]

Attest:

DONALD J. QUIGG

Attesting Officer     Acting Commissioner of Patents and Trademarks